April 5, 1960 J. ENSINK ET AL 2,931,987

CASCADE AMPLIFIER

Filed July 12, 1954

INVENTOR.
JAN VERHAGEN
JOHANNES ENSINK

BY

Frank R Jifari
AGENT 2,931,987

CASCADE AMPLIFIER

Johannes Ensink and Jan Verhagen, Hilversum, Netherlands, assignors, by mesne assignments, to North American Philips Company, Inc., New York, N.Y., a corporation of Delaware

Application July 12, 1954, Serial No. 442,676

Claims priority, application Netherlands July 30, 1953

6 Claims. (Cl. 330—17)

This invention relates to cascade amplifiers comprising transistors in grounded base-connection with transformer-intercoupling in order to match the collector impedance of a preceding transistor to the emitter-impedance of a following transistor of the cascade. It has for its purpose to provide an amplifier having a high amplification factor and little distortion.

In accordance with the present invention, the emitter of the last transistor of the cascade is connected to its base through the series connection of a transformer winding and a bypass capacitor, while the common emitter base circuit starting from said capacitor, comprises a negative feedback impedance to produce a negative feedback signal for the first transistor of the cascade.

In order that the invention may be readily carried into effect it will now be described with reference to the accompanying drawing, given by way of example, wherein.

Figure 1:
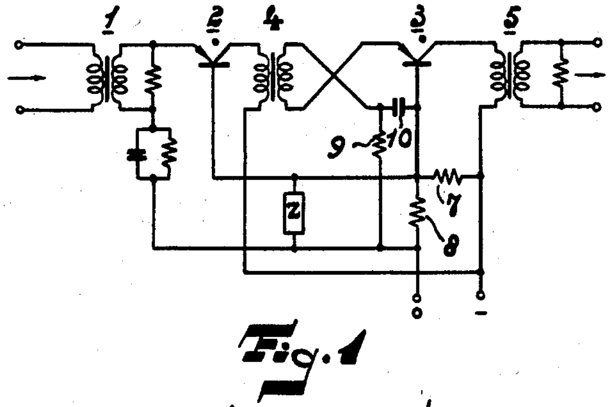
Fig. 1 is a schematic diagram of an embodiment of the invention utilizing two point contact transistors.

In Fig. 1, the signal oscillations are supplied through an input transformer 1 to the emitter of the first transistor 2 of a cascade of transistors 2 and 3 in "grounded base-connection" which are coupled together through a transformer 4 in order to match the collector impedance of the transistor 2 to the emitter impedance of the transistor 3 of the cascade. The load is connected through an output transformer 5 to the collector circuit of the transistor 3. The term "grounded base-connection" is to be understood to mean that the input oscillation is supplied to the emitter circuit and the output oscillation is taken from the collector circuit of the transistor. It is more particularly employed if high frequency signals are to be amplified.

The transistors 2 and 3 are of the point contact type. The required biasses for their bases are produced by means of a potentiometer 7—8. Since the resistor 8 of this potentiometer 7—8 is consequently common to the base circuit of the two transistors 2, 3 and the transformer 4 is at the same time connected as a phase-reversing transformer, the signal oscillations are negatively fed back. If desired, this negative feedback may moreover have a predetermined frequency dependency, for example as a result of a parallel connected suitable impedance Z.

The negative feedback would, however, cause the base current, instead of the collector current as desired, of the transistor 3 to vary linearly with the input signal. In order to linearize the collector current of the transistor 3. the emitter of said transistor is connected to the base of said transistor through the series-combination of the secondary winding of the transformer 4 and a capacitor 10 which bypasses the signal oscillations. Thus, the emitter resistor 9 together with the negative feedback impedance 8–Z connected in parallel therewith with respect to the signal oscillations constitutes a common emitter- and base-impedance. In this manner the signal oscillation produced through said negative feedback impedance changes substantially in accordance with the collector current of the transistor 3, thus obtaining the desired linearization.

Figure 2:
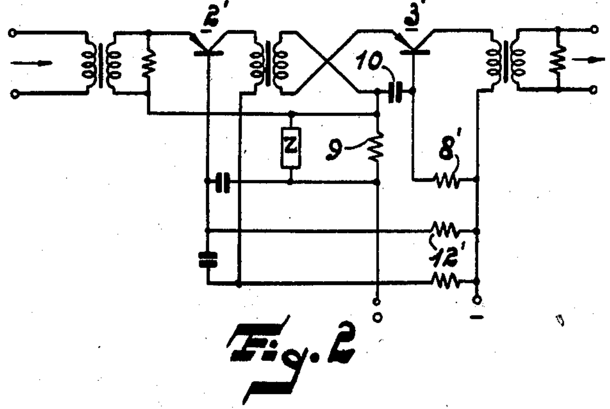
Fig. 2 is a schematic diagram of another embodiment of the invention utilizing two junction transistors.

In Fig. 2 the point contact transistors 2 and 3 shown in Fig. 1 are replaced by the junction transistors 2' and 3'. The bias for the base of the transistor 2' is here produced by means of a bypassed resistor 12', and the bias for the transistor 3' is produced by means of the resistor 8'. In order to produce a negative feedback signal corresponding to the collector current of the transistor 3' the emitter circuit of the transistor 3' comprises a resistor 9 which is connected in parallel with the resistor 8' through the bypass capacitor 10 with respect to signal oscillations and with which, if desired, a frequency-dependent impedance Z may again be connected in parallel, The negative feedback signal is supplied to the emitter of the transistor 2'.

Figure 3:
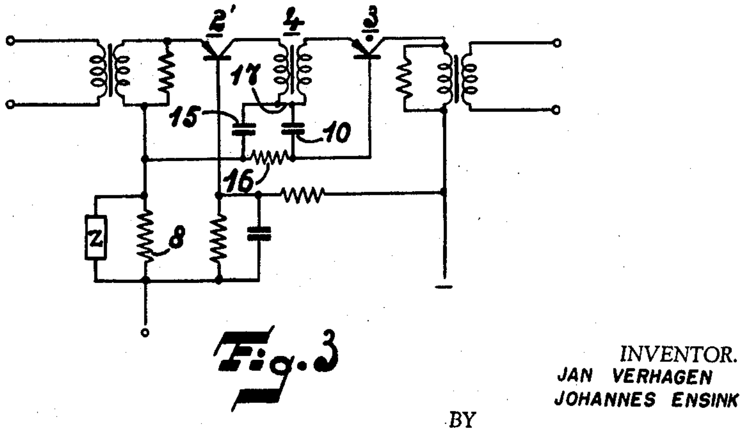
Fig. 3 is a schematic diagram of another embodiment of the invention utilizing a point contact transistor and a junction transistor.

In Fig. 3, the first transistor 2' is of the junction type and the second transistor 3 is of the point contact type. The negative feedback impedance 8–Z provided in the assembled emitter base circuit of the transistor 3 is also included in the emitter circuit of the transistor 2', which consequently has negative feedback. The emitter base circuit of the transistor 3 furthermore comprises the bypass capacitor 10 through which the emitter base bias for said transistor is produced. A resistor 16 which is bypassed by means of a capacitor 15 and through which is produced a voltage which, via the direct current connection 17 between the primary and the secondary of the transformer 4, acts as a collector supply voltage for the transistor 2', thus stabilizing the working point of the transistors 2' and 3.

Of course, the invention may also be used in the cascade of more than two transistors in grounded base-connection and intercoupled through matching transformers. In this case, however, it is more difficult to prevent undue self-oscillation. Alternatively, further impedances may be included in the electrode circuits, for example for stabilization of the direct current setting of the transistors. As a further alternative, an inductance may be connected in series with the resistors 8, 8' and 9 respectively, thus creating a frequency-dependent negative feedback impedance which passes direct current.

What is claimed is:

1. A cascade transistor amplifier circuit comprising first and second transistors each including base, emitter and collector electrodes, the base and emitter electrodes of each transistor forming a signal input circuit, the base and collector electrodes of each transistor forming an output signal circuit, an alternating current input signal source coupled to the input circuit of said first transistor, a transformer having a primary winding and a secondary winding, means for connecting said primary winding in the output circut of said first transistor, one end of said secondary winding being connected to the emitter electrode of said second transistor, the other end of said secondary winding being coupled to the base electrode of said second transistor through a capacitor conductive at signal frequencies, a load coupled to the collector electrode of said second transistor, said load comprising a negative feedback impedance, one end of said impedance being coupled to the base electrode of said second transistor, a source of bias potential, one side of said source being coupled to the collector electrode of said second transistor, the other side of said source being connected to the other end of said negative feedback impedance, means for deriving a feedback signal proportional to the current flowing through said impedance, and means for applying said feedback signal to the signal input circuit of said first transistor in series with said input signal source.

2. A transistor amplifier circuit as claimed in claim 1, wherein the secondary winding of said transformer is connected for phase reversal.

3. A transistor amplifier circuit as claimed in claim 2, wherein said first transistor is of the point-contact type.

4. A transistor amplifier circuit as claimed in claim 2, wherein said first transistor is of the junction type.

5. A transistor amplifier circuit as claimed in claim 3, wherein said second transistor is of point contact type.

6. A transistor amplifier circuit as claimed in claim 4, wherein said second transistor is of junction type.

References Cited in the file of this patent

UNITED STATES PATENTS

| | | |
|---|---|---|
| 2,529,459 | Pourciau et al. | Nov. 7, 1950 |
| 2,647,957 | Mallinckrodt | Aug. 4, 1953 |
| 2,659,774 | Barney | Nov. 17, 1953 |
| 2,730,576 | Caruthers | Jan. 10, 1956 |
| 2,774,826 | Moulon | Dec. 18, 1956 |
| 2,792,553 | Moulon | May 14, 1957 |

OTHER REFERENCES

Shea Text: "Principles of Transistor Circuits," pp. 341–342, pub. 1953 by John Wiley & Sons, N.Y.

Bell Text: "The Transistor," pp. 136, 185, 365, pub. 1951 by Bell Tel. Labs., Inc., N.Y.